(12) United States Patent
Yang

(10) Patent No.: US 9,106,246 B2
(45) Date of Patent: Aug. 11, 2015

(54) SUCCESSIVE APPROXIMATION REGISTER ANALOG-TO-DIGITAL CONVERTER AND ASSOCIATED CONTROL METHOD

(71) Applicant: Realtek Semiconductor Corp., HsinChu (TW)

(72) Inventor: Jun Yang, Suzhou (CN)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/580,181

(22) Filed: Dec. 22, 2014

(65) Prior Publication Data

US 2015/0180498 A1 Jun. 25, 2015

(30) Foreign Application Priority Data

Dec. 24, 2013 (CN) .......................... 2013 1 0721644

(51) Int. Cl.
H03M 1/38 (2006.01)
H03M 1/10 (2006.01)
H03M 1/44 (2006.01)
H03M 1/40 (2006.01)

(52) U.S. Cl.
CPC .............. H03M 1/1028 (2013.01); H03M 1/38 (2013.01); H03M 1/403 (2013.01); H03M 1/442 (2013.01)

(58) Field of Classification Search
CPC ......... H03M 1/403; H03M 1/38; H03M 1/40; H03M 1/1028; H03M 1/442

USPC .......................................... 341/120, 161, 163
See application file for complete search history.

(56) References Cited

U.S. PATENT DOCUMENTS 7,015,841 B2 * 3/2006 Yoshida et al. ................ 341/120
7,724,174 B2    5/2010 Chang
8,547,270 B1 * 10/2013 Strode ............................ 341/161
8,866,653 B2 * 10/2014 Tsai et al. ...................... 341/122

OTHER PUBLICATIONS

Wenbo Liu et al., "A 12-bit, 45-MS/s, 3-mW Redundant Successive-Approximation-Register Analog-to-Digital Converter With Digital Calibration", Nov. 2011, pp. 2661-2672, vol. 46, No. 11, IEEE Journal of Solid-State Circuits.
Ruoyu Xu et al., "Digitally Calibrated 768-kS/s 10-b Minimum-Size SAR ADC Array With Dithering", Sep. 2012, pp. 2129-2140, vol. 47, No. 9, IEEE Journal of Solid-State Circuits.

(Continued)

Primary Examiner — Brian Young
(74) Attorney, Agent, or Firm — Winston Hsu; Scott Margo

(57) ABSTRACT

The present invention provides a successive approximation register analog-to-digital converter (SAR ADC), where a high bit capacitor of the SAR ADC is composed of a plurality of sub-capacitors, and these sub-capacitors are calibrated when the SAR ADC is working. Therefore, the working speed of the SAR ADC will not be influenced. In addition, a capacitance of each sub-capacitor is lower than a redundant capacitance of the SAR ADC, therefore, input signals of the SAR ADC are allowed to have full swing.

13 Claims, 7 Drawing Sheets

(56) References Cited

OTHER PUBLICATIONS

Franz Kuttner, "A 1.2V 10b 20MSample/s Non-Binary Successive Approximation ADC in 0.13μm CMOS", Feb. 5, 2002, p. 176-177, ISSCC 2002/Session 10/High-Speed ADCs/10.6, 2002 IEEE International Solid-State Circuits Conference, San Francisco, CA, USA.

Chun-Cheng Liu, et al., "A 10b 100MS/s 1.13mW SAR ADC with Binary-Scaled Error Compensation", Feb. 10, 2010, p. 386-387 and Figure 21.5.7, ISSCC 2010/Session 21/Successive-Approximation ADCs/21.5, 2010 IEEE International Solid-State Circuits Conference, San Francisco, CA.

\* cited by examiner

SUCCESSIVE APPROXIMATION REGISTER ANALOG-TO-DIGITAL CONVERTER AND ASSOCIATED CONTROL METHOD

BACKGROUND OF THE INVENTION

1. Field of the Invention

The present invention relates to a successive approximation register analog-to-digital converter (SAR ADC), and more particularly, to a SAR ADC and associated control method that can perform background calibration.

2. Description of the Prior Art

In a SAR ADC, a capacitance of each bit capacitor of a bit capacitor array may be different from its designed value due to semiconductor process variation, environment temperature variation or asymmetry/mismatch issue, therefore, errors may occur in digital outputs, and the linearity of the SAR ADC is worsened. To solve this problem, the bit capacitors needs to be calibrated, however, the conventional calibration methods generally have some problems such as influencing a working speed of the SAR ADC or limiting a swing of an input signal to avoid exceeding an encoding range of the SAR ADC ... etc., causing inconvenience and trouble to a designer and operation errors.

SUMMARY OF THE INVENTION

It is therefore an objective of the present invention to provide a SAR ADC and associated control method, which executes a complete background calibration upon the bit capacitors of the SAR ADC without influencing the working speed of the SAR ADC. In addition, the SAR ADC of the present invention does not need to limit the swing of the input signal, that is a full swing input signal is allowed to increase the voltage range to be processed.

According to one embodiment of the present invention, a SAR ADC includes a first bit capacitor array, a second bit capacitor array, a comparator and a processing circuit. The first bit capacitor array is arranged to receive a first input signal, where the first bit capacitor array includes a plurality of first bit capacitors, and at least one of high first bit capacitors is composed of a plurality of sub-capacitors, and each sub-capacitor is selectively connected to a first reference voltage, a second reference voltage or a common voltage via its corresponding switch. The second bit capacitor array is arranged to receive a second input signal, where the second bit capacitor array includes a plurality of second bit capacitors, and at least one of high second bit capacitors is composed of a plurality of sub-capacitors, and each sub-capacitor is selectively connected to the first reference voltage, the second reference voltage or the common voltage via its corresponding switch. The comparator is coupled to the first bit capacitor array and the second bit capacitor array, and is arranged to compare outputs of the first bit capacitor array and the second bit capacitor array to generate a comparison signal. The processing circuit is coupled to the comparator, and is arranged to control capacitor-switching operations of the first bit capacitor array and the second bit capacitor array to generate a digital output of the SAR ADC.

According to another embodiment of the present invention, a method for controlling a SAR ADC is provided. The SAR ADC includes a first bit capacitor array and a second bit capacitor array, where the first bit capacitor array is arranged to receive a first input signal, where the first bit capacitor array includes a plurality of first bit capacitors, and at least one of high first bit capacitors is composed of a plurality of sub-capacitors, and each sub-capacitor is selectively connected to a first reference voltage, a second reference voltage or a common voltage via its corresponding switch; and the second bit capacitor array is arranged to receive a second input signal, where the second bit capacitor array includes a plurality of second bit capacitors, and at least one of high second bit capacitors is composed of a plurality of sub-capacitors, and each sub-capacitor is selectively connected to the first reference voltage, the second reference voltage or the common voltage via its corresponding switch. The method comprises: comparing outputs of the first bit capacitor array and the second bit capacitor array to generate a comparison signal; determining weight values respectively corresponding to the first bit capacitors and the second bit capacitors, where a weight value corresponding to at least one of the high first bit capacitors is obtained by performing calibration upon the sub-capacitors of the high first bit capacitors, and a weight value corresponding to at least one of the high second bit capacitors is obtained by performing calibration upon the sub-capacitors of the high second bit capacitors; and generating a digital output of the SAR ADC according to the comparison signal and the determined weight values.

According to another embodiment of the present invention, a SAR ADC includes a first bit capacitor array, a second bit capacitor array, a comparator and a processing circuit. The first bit capacitor array is arranged to receive a first input signal, where the first bit capacitor array includes a plurality of first bit capacitors, and at least one of high first bit capacitors is composed of a plurality of sub-capacitors. The second bit capacitor array is arranged to receive a second input signal, where the second bit capacitor array includes a plurality of second bit capacitors, and at least one of high second bit capacitors is composed of a plurality of sub-capacitors. The comparator is coupled to the first bit capacitor array and the second bit capacitor array, and is arranged to compare outputs of the first bit capacitor array and the second bit capacitor array to generate a comparison signal. The processing circuit is coupled to the comparator, and is arranged to control capacitor-switching operations of the first bit capacitor array and the second bit capacitor array to generate an N-bit digital output of the SAR ADC according to the comparison signal. In addition, for each first bit-capacitor of the first bit capacitor array, the first bit-capacitor whose capacitance is greater than a redundant capacitance is composed to a plurality of sub-capacitors, and a capacitance of each sub-capacitor is smaller than the redundant capacitance, where the redundant capacitance is a difference between a summation of capacitances of a unit capacitor and the first bit capacitors with $2^{(N-1)}$ times a capacitance of a least first bit capacitors.

These and other objectives of the present invention will no doubt become obvious to those of ordinary skill in the art after reading the following detailed description of the preferred embodiment that is illustrated in the various figures and drawings.

DETAILED DESCRIPTION

In the SAR ADC, the linearity is dependent upon the matching degree of the bit capacitors (i.e. the degree of difference between the real capacitance of the bit capacitor with its designed value described in "Description of the Prior Art"). Therefore, many bit capacitors must be designed to have large capacitance to guarantee the accuracy of the bit capacitors, and large chip area and large power are required. For example, it may require four times chip area to gain two times accuracy, therefore, if the requirement of the matching degree of the bit capacitors can be decreased in half, the chip area can be largely decreased. Therefore, in order to decrease the requirement of the matching degree of the bit capacitors, some calibration mechanisms of the bit capacitors are used in the SAR ADC to save the capacitor area in the chip and power consumption, increase the working speed, improve some quality indicators of the SAR ADC, such as integrated non-linearity (INL), differential non-linearity (DNL), spurious free dynamic range (SFRD) and signal-to-noise and distortion ratio (SNDR) . . . etc.

The SAR ADC of the present invention calibrates the bit capacitors by using complete background calibration method to obtain weight values of the bit capacitors, where the weight value is a capacitance ratio between the bit capacitor and a least bit capacitor. Particularly, in the present invention, the operations of the SAR ADC will not stop when the bit capacitors calibration process is performed, and the temperature variation and component aging issue can be adaptively adjusted, therefore, the SAR ADC of the present invention can not only largely improve linearity and dynamic characteristic but consider the working efficiency.

In addition, the bit capacitors of the SAR ADC use the redundant capacitance design rather than the conventional binary weighted capacitors design. Taking N bit SAR ADC as an example, the term "redundant capacitance" is defined as a difference between a summation of capacitances of a unit capacitor and the bit capacitors with $2^{(N-1)}$ times a capacitance of a least bit capacitor, and in the preferred embodiment N is a positive integer. In addition, in the SAR ADC of the present invention, a portion of high bit capacitor(s) is divided into a plurality of sub-capacitors, and the capacitance of each sub-capacitor is less than the redundant capacitance. Therefore, the SAR ADC does not need to limit the swing of the input signal when the background calibration is performed, that is a full swing input signal is allowed to increase the voltage range to be processed. The detailed implementation of the SAR ADC of the present invention is described as follows.

Figure 1:
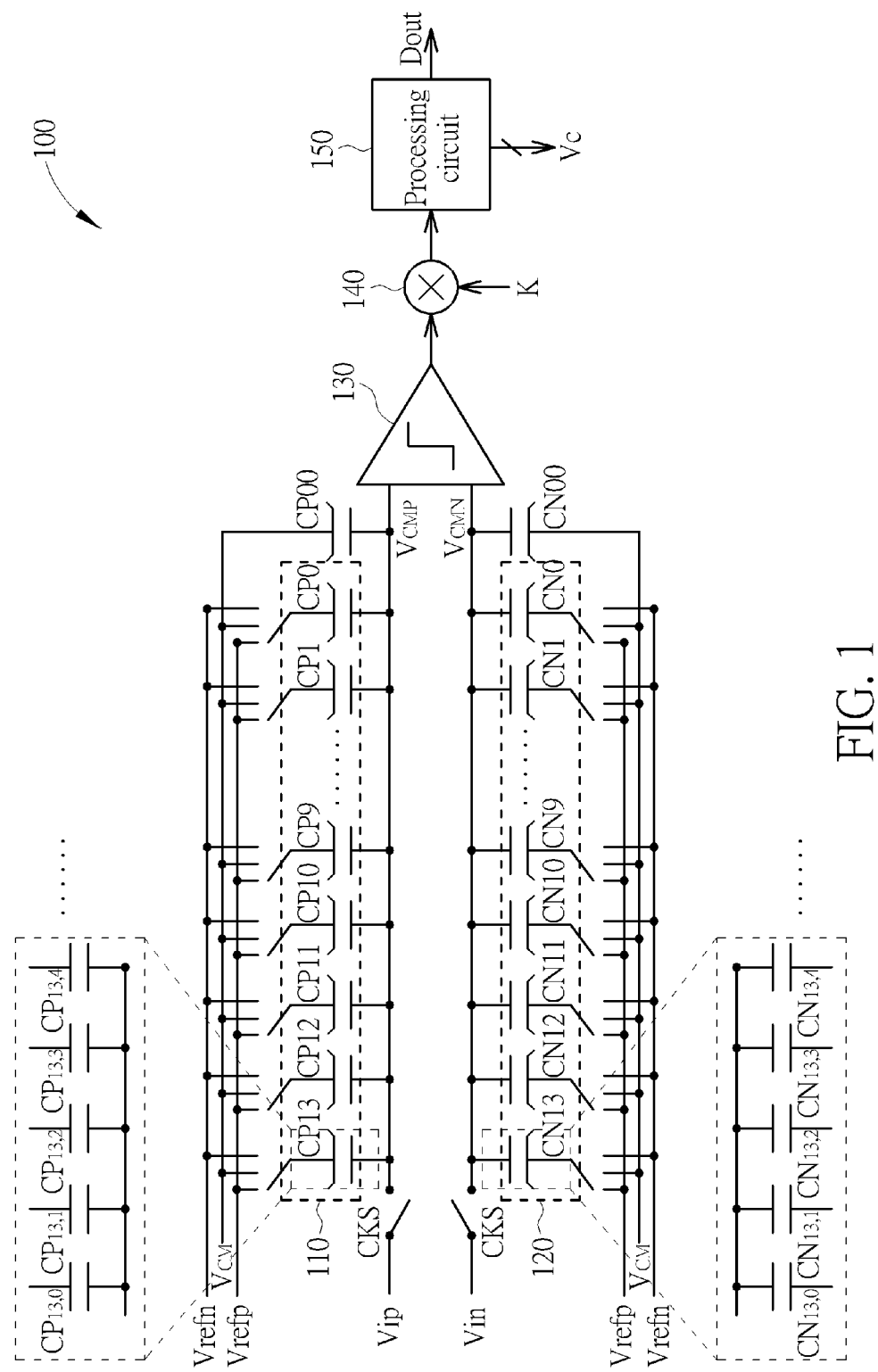
FIG. 1 is a diagram illustrating a SAR ADC according to one embodiment of the present invention.

Please refer to FIG. 1, which is a diagram illustrating a SAR ADC 100 according to one embodiment of the present invention. As shown in FIG. 1, the SAR ADC 100 comprises a first bit capacitor array 110, a second bit capacitor array 120, a comparator 130, a multiplier 140, a processing circuit 150, and two unit capacitors CP00 and CN00. The first bit capacitor array 110 comprises a plurality of bit capacitors CP0-CP13, each of the bit capacitors CP0-CP13 is selectively connected to a first reference voltage Vrefp, a second reference voltage Vrefn or a common voltage $V_{CM}$ via a switch, and each of the bit capacitors CP10-CP13 are divided into a plurality of sub-capacitors (e.g. the bit capacitor CP13 shown in FIG. 1 is divided into sub-capacitors $CP_{13,0}$, $CP_{13,1}$, $CP_{13,2}$, $CP_{13,3}$, $CP_{13,4}$), and each of the sub-capacitors is independently connected to the first reference voltage Vrefp, the second reference voltage Vrefn or the common voltage $V_{CM}$ via a switch. The second bit capacitor array 120 comprises a plurality of bit capacitors CN0-CN13, each of the bit capacitors CN0-CN13 is selectively connected to the first reference voltage Vrefp, the second reference voltage Vrefn or the common voltage $V_{CM}$ via a switch, and each of the bit capacitors CN10-CN13 are divided into a plurality of sub-capacitors (e.g. the bit capacitor CN13 shown in FIG. 1 is divided into sub-capacitors $CN_{13,0}$, $CN_{13,1}$, $CN_{13,2}$, $CN_{13,3}/CN_{13,4}$), and each of the sub-capacitors is independently connected to the first reference voltage Vrefp, the second reference voltage Vrefn or the common voltage $V_{CM}$ via a switch. In one embodiment, the first reference voltage Vrefp is a positive reference voltage, the second reference voltage Vrefn is a negative reference voltage, and the first reference voltage Vrefp and the second reference voltage Vrefn are symmetric with the common voltage $V_{CM}$, that is $V_{CM}=0.5*(Vrefp+Vrefn)$. In addition, all the switches shown in FIG. 1 are controlled by a plurality of control signals Vc generated from the processing circuit 150.

In this embodiment, the SAR ADC 100 is a 12-bit SAR ADC, that is the SAR ADC 100 receives a first input signal Vip and a second input signal Vin to generate a 12-bit digital output Dout. In one embodiment, the first input signal Vip is a positive input voltage, the second input signal Vin is a negative input voltage, and the first input signal Vip and the second input signal are symmetric with a voltage level. In addition, although each of the first bit capacitor array 110 and the second bit capacitor array 120 shown in FIG. 1 has fourteen bit capacitors, in other designs quantity of the bit capacitors included in each of the first bit capacitor array 110 and the second bit capacitor array 120 may be twelve or thirteen or fifteen and so on, these alternative designs shall fall within the scope of the present invention.

In this embodiment, assuming that the SAR ADC 100 is a N-bit SAR ADC (in the embodiment shown in FIG. 1, N is equal to 12), quantity of the bit capacitors included in each of the first bit capacitor array 110 and the second bit capacitor array 120 is P (in the embodiment shown in FIG. 1, P is equal to 14), where P needs to be greater than (N−1). The bit capacitors are represented by C0, C1, C2, . . . , C(P−1) in the following description (corresponding to CN0-CN13 and CP0-CP13 shown in FIG. 1), where C0 is a least bit capacitor, and the capacitance of each of the other bit capacitors (i.e. C1-C(P−1)) is an integral multiples of C0. In addition, in this embodiment a portion of high bit capacitors are divided into several sub-capacitors, for example the bit capacitor Ci is divided into M sub-capacitors, that is $$Ci = \sum_{j=0}^{j=M-1} C_{i,j}.$$

In addition, in a preferred embodiment, the design for the bit capacitors need to satisfy the following conditions:

$$Ci \le C00 + \sum_{j=0}^{j=i-1} Cj (1 \le i \le P-1), \qquad (1)$$

that is for each bit capacitor, its capacitance is not greater than a summation of capacitances of the unit capacitor and all the lower bit capacitors, where the unit capacitor CP00/CN00 and the capacitor CP0/CN0 may have the same capacitance;

$$C0 + \sum_{j=0}^{j=P-1} Cj \geq 2^{N-1} \times C0, \quad (2)$$

that is a summation of capacitances of a unit capacitor and all the bit capacitors is not lower than $2^{(N-1)}$ times a capacitance of a least bit capacitor;

$$C_{i,j} \leq \sum_{j=0}^{j=P-1} Cj + C0 - 2^{N-1} \times C0, \quad (3)$$

that is the capacitance of each sub-capacitor is less than a redundant capacitance, where the redundant capacitance is defined as a difference between a summation of capacitances of a unit capacitor and all the bit capacitors with $2^{(N-1)}$ times a capacitance of a least bit capacitor, that is the redundant capacitance is defined as $$\sum_{j=0}^{j=P-1} Cj + C0 - 2^{N-1} \times C0.$$

In the above-mentioned symbols, C0 is the least bit capacitor, Ci is the bit capacitor within the first bit capacitor array 110 or the second bit capacitor array 120.

Referring to the above-mentioned three conditions, the bit capacitors within the first bit capacitor array 110 or the second bit capacitor array 120 can be designed to have the capacitances as follows, where the unit of the capacitances in Table 1 is C0:

TABLE 1

|  | C13 | C12 | C11 | C10 | C9 | C8 | C7 |
|---|---|---|---|---|---|---|---|
| Ci | 896 | 512 | 384 | 256 | 136 | 68 | 40 |
| $C_0 + \sum_{j=0}^{j=i-1} C_j$ | 1449 | 937 | 553 | 297 | 161 | 93 | 53 |

|  | C6 | C5 | C4 | C3 | C2 | C1 | C0 | C00 |
|---|---|---|---|---|---|---|---|---|
| Ci | 24 | 12 | 8 | 4 | 2 | 1 | 1 | 1 |
| $C_0 + \sum_{j=0}^{j=i-1} C_j$ | 29 | 17 | 9 | 5 | 3 | 2 | 1 |  |

In Table 1, the redundant capacitance is $$\sum_{j=0}^{j=P-1} C_j + C_0 - 2^{N-1} \times C_0$$

Therefore, the capacitances of the divided sub-capacitors need to be less than 297*C0. Table 2 shows an example of dividing the capacitors C13, C12, C11 and C10 (C13, C12, C11 and C10 correspond to CN13/CP13, CN12/CP12, CN11/CP11 and CN10/CP10, respectively), where the unit of the capacitances in Table 2 is C0:

TABLE 2

|  | $C_{13,0}$ | $C_{13,1}$ | $C_{13,2}$ | $C_{13,3}$ | | $C_{13,4}$ | |
|---|---|---|---|---|---|---|---|
| $C_{i,j}$ | 192 | 192 | 192 | 192 | | 128 | |
| Ci | | | | C13 = 896 | | | |

|  | $C_{12,0}$ | $C_{12,1}$ | $C_{12,2}$ | $C_{11,0}$ | $C_{11,1}$ | $C_{10,0}$ | $C_{10,1}$ |
|---|---|---|---|---|---|---|---|
| $C_{i,j}$ | 192 | 192 | 128 | 192 | 192 | 128 | 128 |
| Ci | | C12 = 512 | | | C11 = 384 | | C10 = 256 |

In this embodiment, because the redundant capacitance is 297*C0, therefore, the bit capacitor whose capacitance lower than 297*C0 does not need be divided, but the operations of the SAR ADC 100 will not be influenced even if the bit capacitor whose capacitance lower than 297*C0 is divided into several sub-capacitors. For example, the capacitance of the bit capacitor C10 is equal to 256*C0, therefore, the bit capacitor C10 may not be divided into two sub-capacitors $C_{10,0}$ and $C_{10,1}$ in other embodiment.

In addition, in one embodiment, the sub-capacitors included in a bit capacitor are suggested to have the same capacitance. In a preferred embodiment, all the sub-capacitors included in a bit capacitor have the same capacitance, such as the bit capacitors C11 and C10 shown in Table 2.

It is noted that the capacitances shown in Table 1 and Table 2 are designed values, that is ideal capacitances of the bit capacitors of the SAR ADC 100. However, in practice, the capacitances of the bit capacitors of the SAR ADC 100 may be different from their designed value due to semiconductor process variation, environment temperature variation or asymmetry/mismatch issue. Therefore, the processing circuit 150 needs to calibrate these bit capacitors to obtain the real capacitances. In the following description, Wi is a ratio between the bit capacitor Ci and the least bit capacitor C0 (Wi is also a value of each bit capacitor in the above Table 1), that is Wi=Ci/C0; and $W_{i,j}$ is a ratio between the sub-capacitor $C_{i,j}$ and the least bit capacitor C0, that is $W_{i,j}=C_{i,j}/C0$; and the processing circuit 150 is used to calculate an real weight value of each bit capacitor Ci.

Figure 2:
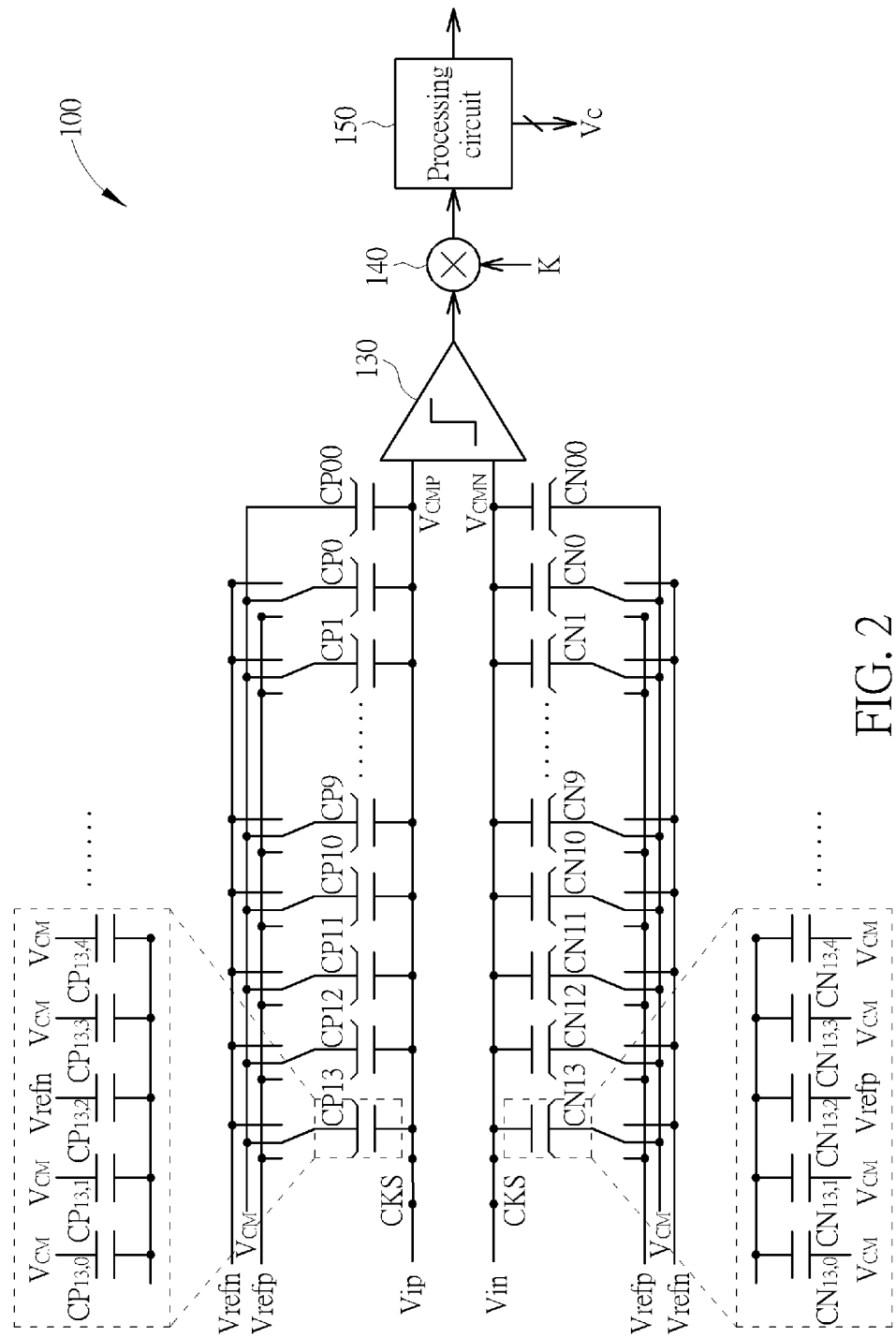
FIG. 2 is a diagram illustrating the SAR ADC calibrating a sub-capacitor during a sampling phase according to one embodiment of the present invention.
Figure 3:
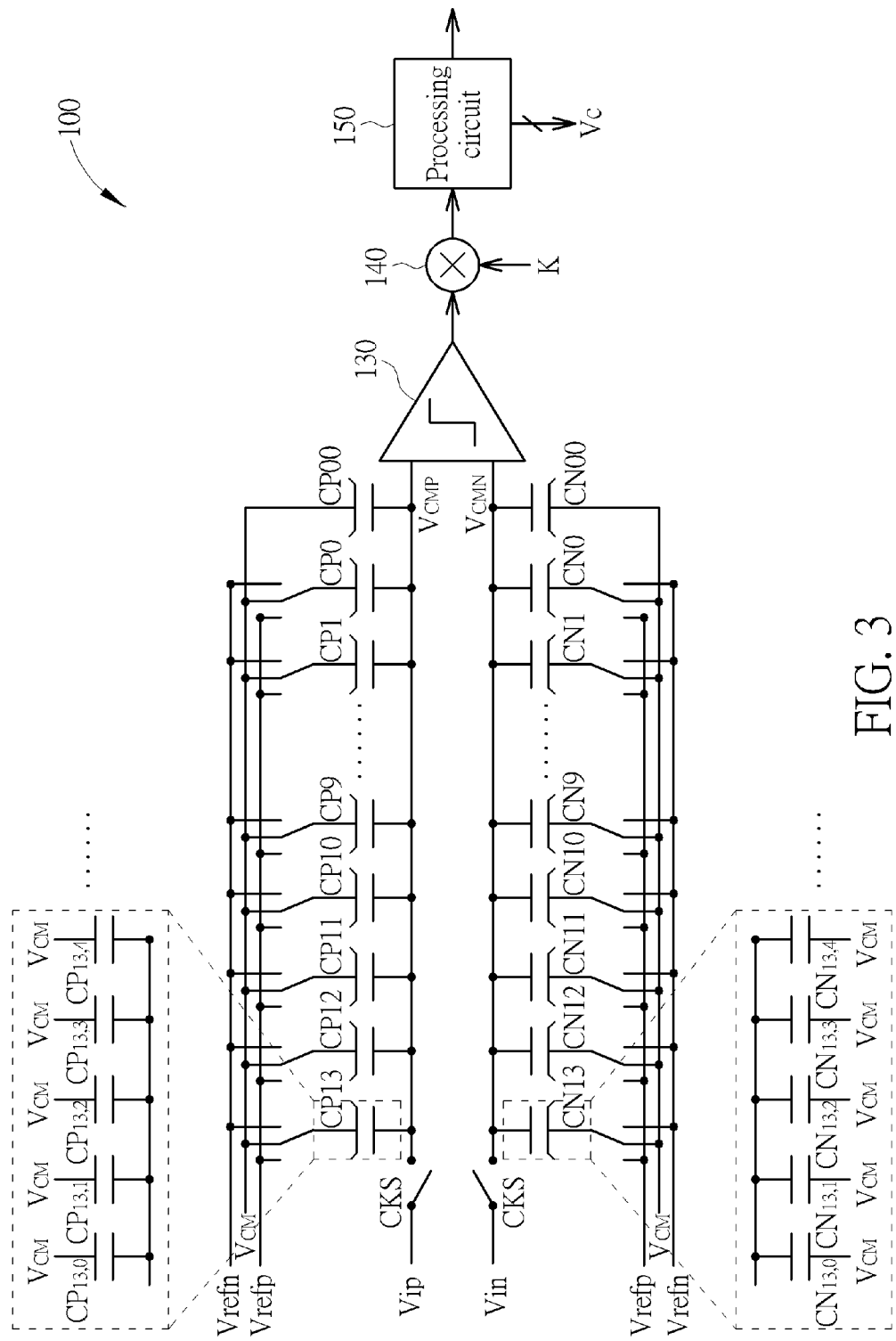
FIG. 3 is a diagram illustrating the SAR ADC calibrating a sub-capacitor during a holding phase according to one embodiment of the present invention.

Please refer to FIG. 2 and FIG. 3, which is a diagram illustrating the SAR ADC 100 calibrating a sub-capacitor according to one embodiment of the present invention, where FIG. 2 shows a sampling phase, and FIG. 3 shows a holding phase. Please refer to FIG. 2 first, in the sampling phase, the switch CKS is switched on, and the first input signal Vip and the second input signal Vin are sampled on nodes $V_{CMP}$ and $V_{CMN}$, respectively. Assuming that the sub-capacitors $CP_{13,2}$ and $CN_{13,2}$ are calibrated, and when a pseudo random sequence K is equal to "1", the nodes of the sub-capacitors $CP_{13,2}$ and $CN_{13,2}$ are connected to the second reference voltage Vrefn and the first reference voltage Vrefp, respectively; and when the pseudo random sequence K is equal to "−1", the nodes of the sub-capacitors $CP_{13,2}$ and $CN_{13,2}$ are connected to the first reference voltage Vrefp and the second reference voltage Vrefn, respectively. In addition, the nodes of all the other bit capacitor and sub-capacitors not relating to this calibration are connected to the common voltage $V_{CM}$.

After the sampling phase is finished, the SAR ADC 100 enters the holding phase. In the holding phase, the switch CKS is switched off, and the nodes of the sub-capacitors $CP_{13,2}$ and $CN_{13,2}$ are connected to the common voltage $V_{CM}$. Therefore, the dithering signal (i.e. $K*W_{13,2}$) is added into the input signal. Then, the input signal added by the dithering signal is quantized by the SAR ADC 100, and the quantized digital code is multiplied by the pseudo random sequence K, then the weight value $W_{13,2}$ can be obtained by calculate an average of the aggregation of the quantized digital code is multiplied by the pseudorandom sequence K.

Method for determining the weight value $W_{13,2}$ of the sub-capacitor $C_{13,2}$ is as follows: assuming that the input signal is represented by VIN, where VIN=Vip−Vin, and assuming that the digital output of the SAR ADC 100 is represented by DIN, where VIN=DIN+$Q_N$, and $Q_N$ is a quantization error. Because the input signal is added by the dithering signal, that is VIN+(K*$W_{13,2}$), and pseudo random sequence K is "1" or "−1", at this time the digital output of the SAR ADC 100 is represented by Dout, the equation becomes VIN+(K*$W_{13,2}$)=Dout+$Q_N$. Then, the digital output Dout is multiplied by K, and the result is performed by the aggregation and average operation as follows:

$$\overline{K \cdot Dout} = \overline{K \cdot VIN} + \overline{W_{13,2}} - \overline{K \cdot Q_N} = \overline{K \cdot VIN} + W_{13,2} - \overline{K \cdot Q_N} = W_{13,2} + e$$

If the pseudorandom sequence K is long enough, the value "e" will approach zero, and the weight value $W_{13,2}$ can be obtained.

By using the same calculating steps, the weight values of the other sub-capacitors $C_{13,0}$, $C_{13,1}$, ... of the SAR ADC 100 can be obtained. In the following operations of the SAR ADC 100, the divided sub-capacitors are used as a whole, that is the sub-capacitors $C_{13,0}$, $C_{13,1}$, $C_{13,2}$, $C_{13,3}$, $C_{13,4}$ are controlled as a single bit capacitor C13. As for the following switched capacitor control, similar to the conventional SAR ADC, the switched capacitor control is depends on an output of the comparator 130 to achieve the negative feedback convergence. Because a person skilled in this art should understand these operations of the SAR ADC, details about the switched capacitor control of the SAR ADC is omitted here.

In addition, in this embodiment, all the sub-capacitors are calibrated all the time to update their weight values, and the processing circuit 150 generates the digital output by using the updated weight values. In another embodiment of the present invention, the sub-capacitors are calibrated during a period after the SAR ADC 100 starts to work, and the calibration steps can be stopped when the weight values of the sub-capacitors are stabilized. These alternative designs shall fall within the scope of the present invention.

In addition, the digital output Dout generate from the processing circuit 150 can be calculated by the following formula (not a limitation of the present invention):

$$D_{out} = \sum_{i=0}^{i=P-1} W_{P-i-1} \cdot (2b_{i+1} - 1) + b_{P+1} + 2^{N-1} - 1 + Q_N,$$

where bi is the $i^{th}$ code output by the comparator 130, P is a quantity of the bit capacitors within the first bit capacitor array 110 (in FIG. 1, P=14), and $Q_N$ is quantization error.

Figure 4:
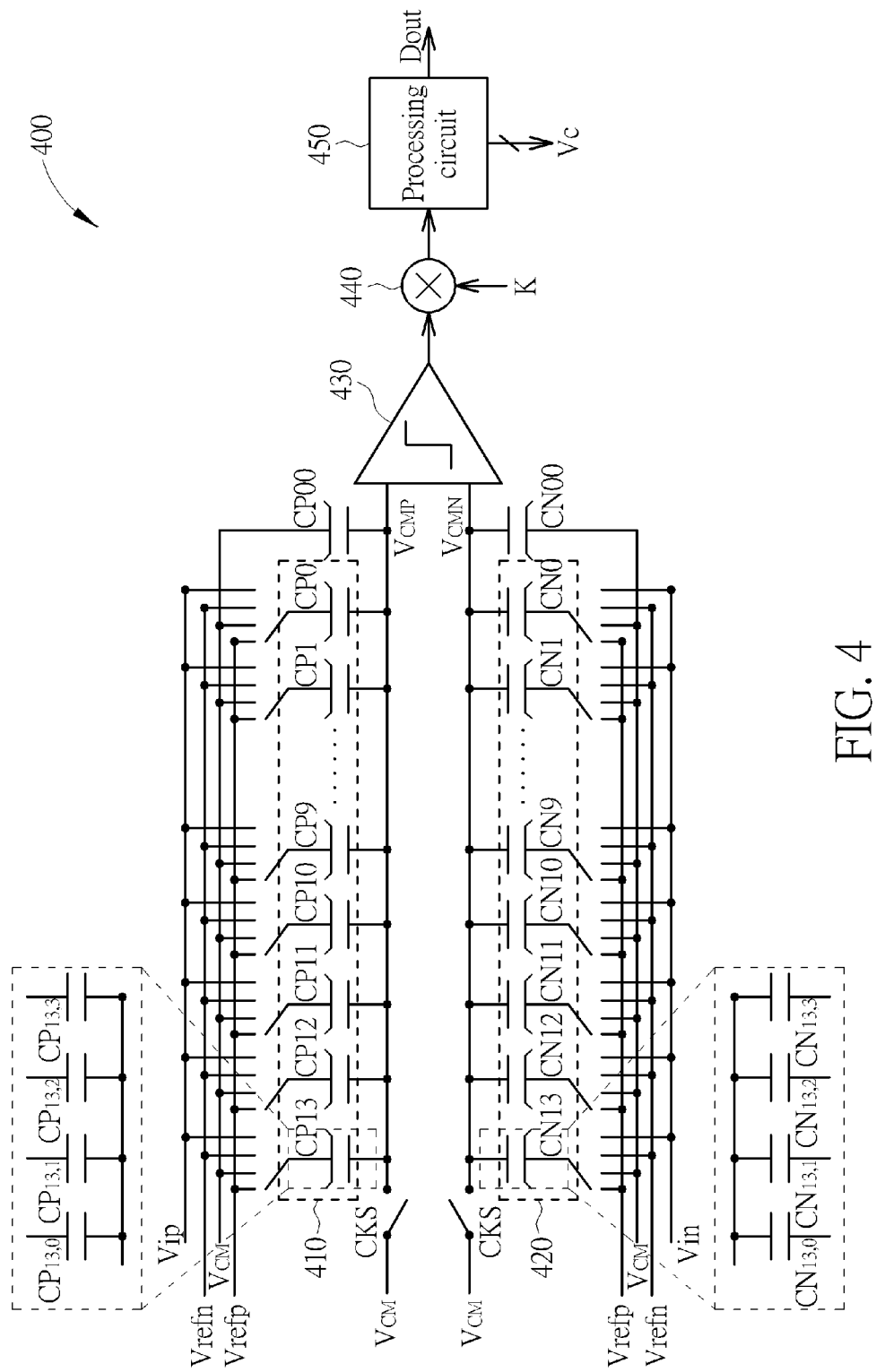
FIG. 4 is a diagram illustrating a SAR ADC according to another embodiment of the present invention.

Please refer to FIG. 4, which is a diagram illustrating a SAR ADC 400 according to one embodiment of the present invention. As shown in FIG. 4, the SAR ADC 400 comprises a first bit capacitor array 410, a second bit capacitor array 420, a comparator 430, a multiplier 440, a processing circuit 450, and two unit capacitors CP00 and CN00. The first bit capacitor array 410 comprises a plurality of bit capacitors CP0-CP13, each of the bit capacitors CP0-CP13 is selectively connected to a first input signal Vip, a first reference voltage Vrefp, a second reference voltage Vrefn or a common voltage $V_{CM}$ via a switch, and each of the bit capacitors CP12-CP13 are divided into a plurality of sub-capacitors (e.g. the bit capacitor CP13 shown in FIG. 4 is divided into sub-capacitors $CP_{13,0}$, $CP_{13,1}$, $CP_{13,2}$, $CP_{13,3}$), and each of the sub-capacitors is independently connected to the first input signal Vip, the first reference voltage Vrefp, the second reference voltage Vrefn or the common voltage $V_{CM}$ via a switch. The second bit capacitor array 420 comprises a plurality of bit capacitors CN0-CN13, each of the bit capacitors CN0-CN13 is selectively connected to a second input signal Vin, the first reference voltage Vrefp, the second reference voltage Vrefn or the common voltage $V_{CM}$ via a switch, and each of the bit capacitors CN12-CN13 are divided into a plurality of sub-capacitors (e.g. the bit capacitor CN13 shown in FIG. 4 is divided into sub-capacitors $CN_{13,0}$, $CN_{13,1}$, $CN_{13,2}$, $CN_{13,3}$), and each of the sub-capacitors is independently connected to the second input signal Vin, the first reference voltage Vrefp, the second reference voltage Vrefn or the common voltage $V_{CM}$ via a switch. In addition, all the switches shown in FIG. 4 are controlled by a plurality of control signals Vc generated from the processing circuit 450.

In this embodiment, the SAR ADC 400 is a 12-bit SAR ADC, that is the SAR ADC 400 receives a first input signal Vip and a second input signal Vin to generate a 12-bit digital output Dout. In addition, although each of the first bit capacitor array 410 and the second bit capacitor array 420 shown in FIG. 4 has fourteen bit capacitors, in other designs quantity of the bit capacitors included in each of the first bit capacitor array 410 and the second bit capacitor array 420 may be twelve or thirteen or fifteen and so on, these alternative designs shall fall within the scope of the present invention.

In this embodiment, assuming that the SAR ADC 400 is a N-bit SAR ADC (in the embodiment shown in FIG. 4, N is equal to 12), quantity of the bit capacitors included in each of the first bit capacitor array 410 and the second bit capacitor array 420 is P (in the embodiment shown in FIG. 4, P is equal to 14), where P needs to be greater than (N−1). The bit capacitors are represented by C0, C1, C2, ..., C(P−1) in the following description (corresponding to CN0-CN13 and CP0-CP13 shown in FIG. 4), where C0 is a least bit capacitor, and the capacitance of each of the other bit capacitors (i.e. C1-C(P−1)) is an integral multiples of C0. In addition, in this embodiment a portion of high bit capacitors are divided into several sub-capacitors, for example the bit capacitor Ci is divided into M sub-capacitors, that is $$Ci = \sum_{j=0}^{j=M-1} C_{i,j}.$$

In addition, in a preferred embodiment, the design for the bit capacitors need to satisfy the following conditions:

$$Ci \leq C00 + \sum_{j=0}^{j=i-1} Cj (1 \leq i \leq P-1), \quad (1)$$

that is for each bit capacitor, its capacitance is not greater than a summation of capacitances of the unit capacitor and all the lower bit capacitors;

$$C0 + \sum_{j=0}^{j=P-1} Cj \geq 2^{N-1} \times C0, \quad (2)$$

that is a summation of capacitances of a unit capacitor and all the bit capacitors is not lower than $2^{(N-1)}$ times a capacitance of a least bit capacitor;

$$C_{i,j} \leq \sum_{j=0}^{j=P-1} Cj + C0 - 2^{N-1} \times C0, \quad (3)$$

that is the capacitance of each sub-capacitor is less than a redundant capacitance, where the redundant capacitance is defined as a difference between a summation of capacitances of a unit capacitor and all the bit capacitors with $2^{(N-1)}$ times a capacitance of a least bit capacitor, that is the redundant capacitance is defined as $$\sum_{j=0}^{j=P-1} Cj + C0 - 2^{N-1} \times C0.$$

In the above-mentioned symbols, C0 is the least bit capacitor, Ci is the bit capacitor within the first bit capacitor array 410 or the second bit capacitor array 420.

Referring to the above-mentioned three conditions, the bit capacitors within the first bit capacitor array 410 or the second bit capacitor array 420 can be designed to have the capacitances as follows, where the unit of the capacitances in Table 3 is C0:

TABLE 3

|  | C13 | C12 | C11 | C10 | C9 | C8 | C7 |
|---|---|---|---|---|---|---|---|
| Ci | 1024 | 512 | 256 | 256 | 128 | 64 | 32 |
| $C_0 + \sum_{j=0}^{j=i-1} C_j$ | 1297 | 785 | 529 | 273 | 145 | 81 | 49 |

|  | C6 | C5 | C4 | C3 | C2 | C1 | C0 | C00 |
|---|---|---|---|---|---|---|---|---|
| Ci | 16 | 16 | 8 | 4 | 2 | 1 | 1 | 1 |
| $C_0 + \sum_{j=0}^{j=i-1} C_j$ | 33 | 17 | 9 | 5 | 3 | 2 | 1 |  |

In Table 3, the redundant capacitance is $$\sum_{j=0}^{j=P-1} C_j + C_0 - 2^{N-1} \times C_0$$

=273*C0. Therefore, the capacitances of the divided sub-capacitors need to less than 273*C0. Table 4 shows an example of dividing the capacitors C13 and C12 (C13 and C12 correspond to CN13/CP13 and CN12/CP12, respectively), where the unit of the capacitances in Table 4 is C0:

TABLE 4

|  | $C_{13,0}$ | $C_{13,1}$ | $C_{13,2}$ | $C_{13,3}$ | $C_{12,0}$ | $C_{12,1}$ |
|---|---|---|---|---|---|---|
| $C_{i,j}$ | 256 | 256 | 256 | 256 | 256 | 256 |
| Ci |  | C13 = 1024 |  |  | C12 = 512 |  |

In this embodiment, because the redundant capacitance is 273*C0, therefore, the bit capacitor whose capacitance lower than 273*C0 does not need be divided, but the operations of the SAR ADC 400 will not be influenced even if the bit capacitor whose capacitance lower than 273*C0 is divided into several sub-capacitors.

In addition, in one embodiment, the sub-capacitors included in a bit capacitor are suggested to have the same capacitance. In a preferred embodiment, all the sub-capacitors included in a bit capacitor have the same capacitance, such as the bit capacitors C13 and C12 shown in Table 4.

It is noted that the capacitances shown in Table 3 and Table 4 are designed values, that is ideal capacitances of the bit capacitors of the SAR ADC 400. However, in practice, the capacitances of the bit capacitors of the SAR ADC 400 may be different from their designed values due to semiconductor process variation, environment temperature variation or asymmetry/mismatch issue. Therefore, the processing circuit 450 needs to calibrate these bit capacitors to obtain the real capacitances. In the following description, Wi is a ratio between the bit capacitor Ci and the least bit capacitor C0 (Wi is also a value of each bit capacitor in the above Table 1), that is Wi=Ci/C0; and $W_{i,j}$ is a ratio between the sub-capacitor $C_{i,j}$ and the least bit capacitor C0, that is $W_{i,j}=C_{i,j}/C0$; and the processing circuit 450 is used to calculate an real weight value of each bit capacitor Ci.

Figure 5:
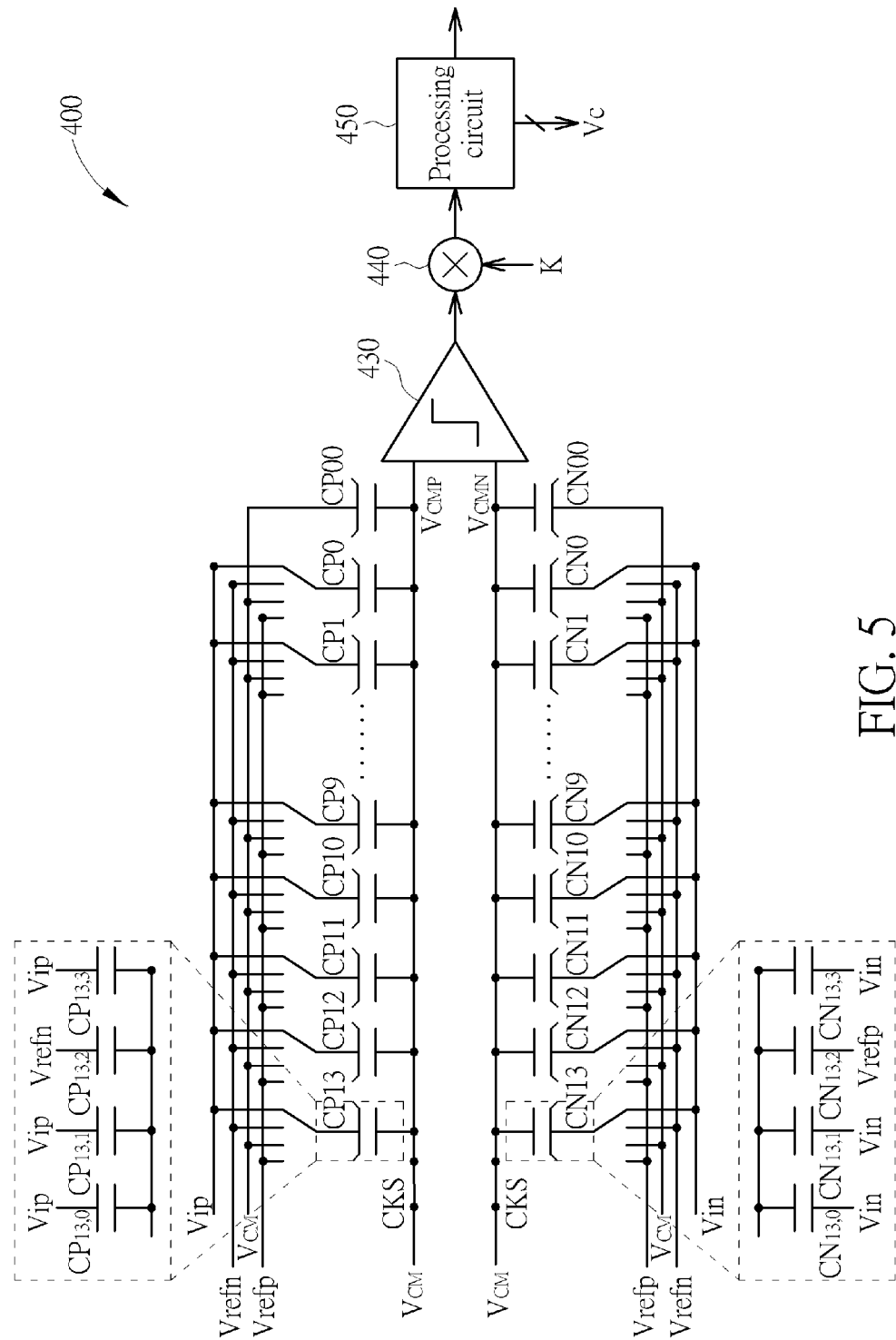
FIG. 5 is a diagram illustrating the SAR ADC calibrating a sub-capacitor during a sampling phase according to one embodiment of the present invention.
Figure 6:
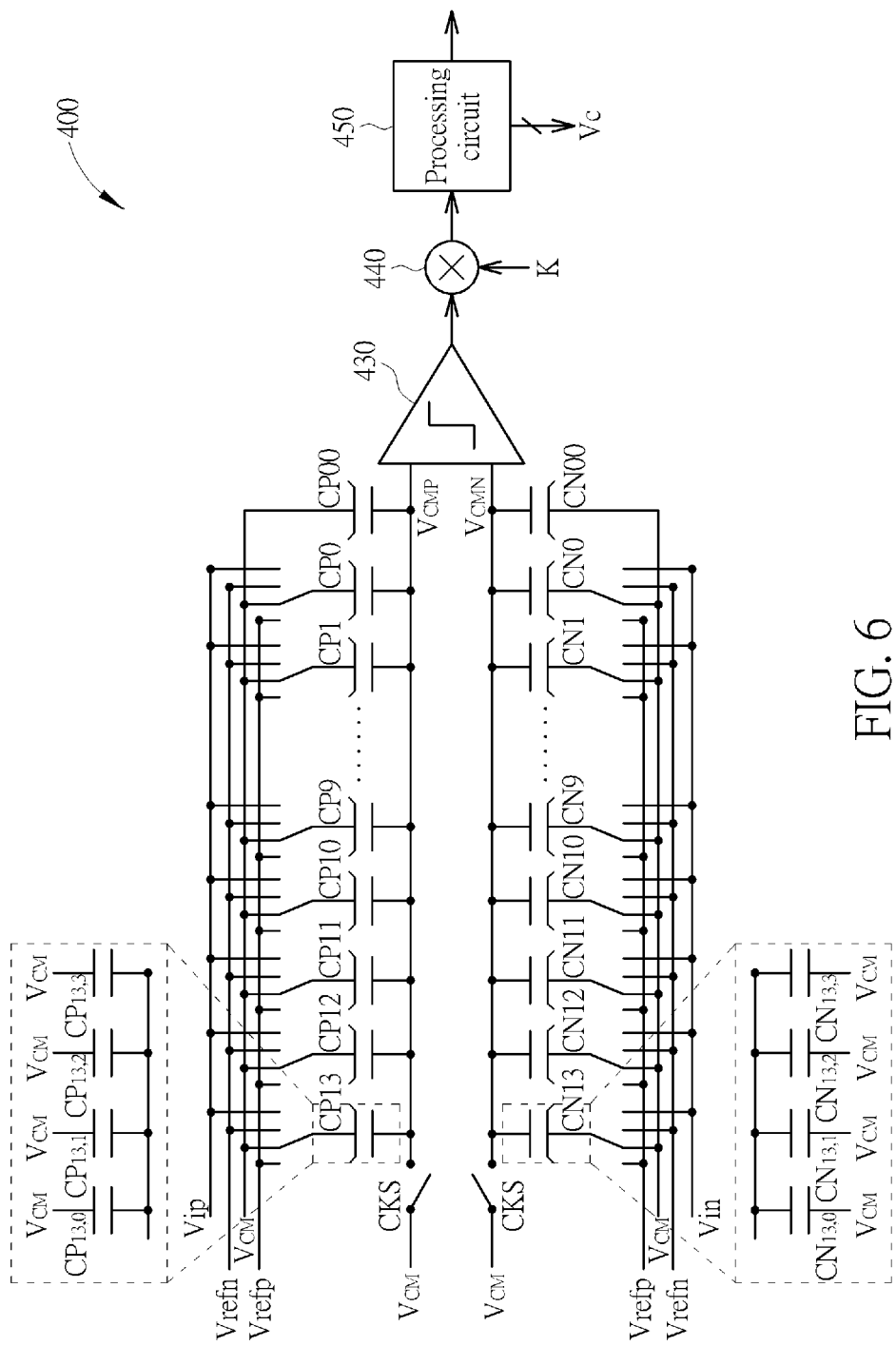
FIG. 6 is a diagram illustrating the SAR ADC calibrating a sub-capacitor during a holding phase according to one embodiment of the present invention.

Please refer to FIG. 5 and FIG. 6, which is a diagram illustrating the SAR ADC 400 calibrating a sub-capacitor according to one embodiment of the present invention, where FIG. 5 shows a sampling phase, and FIG. 6 shows a holding phase. Please refer to FIG. 5 first, in the sampling phase, the switch CKS is switched on, and the common voltage $V_{CM}$ are sampled on nodes $V_{CMP}$ and $V_{CMN}$, respectively. Assuming that the sub-capacitors $CP_{13,2}$ and $CN_{13,2}$ are calibrated, and when a pseudorandom sequence K is equal to "1", the nodes of the sub-capacitors $CP_{13,2}$ and $CN_{13,2}$ are connected to the second reference voltage Vrefn and the first reference voltage Vrefp, respectively, and the nodes of the other bit capacitors within the first bit capacitor array 410 are connected to the first input signal Vip, and the nodes of the other bit capacitors within the second bit capacitor array 420 are connected to the second input signal Vin; and when the pseudorandom sequence K is equal to "−1", the nodes of the sub-capacitors $CP_{13,2}$ and $CN_{13,2}$ are connected to the first reference voltage Vrefp and the second reference voltage Vrefn, respectively, and the nodes of the other bit capacitors within the first bit capacitor array 410 are connected to the first input signal Vip, and the nodes of the other bit capacitors within the second bit capacitor array 420 are connected to the second input signal Vin.

After the sampling phase is finished, the SAR ADC 400 enters the holding phase shown in FIG. 6. In the holding phase, the switch CKS is switched off, and the nodes of the sub-capacitors $CP_{13,2}$ and $CN_{13,2}$ and the nodes of all the other bit capacitors and sub-capacitors are connected to the common voltage $V_{CM}$. Therefore, the dithering signal (i.e. $K^*W_{13,2}$) is added into the input signal. Then, the input signal added by the dithering signal is quantized by the SAR ADC 400, and the quantized digital code is multiplied by the pseudorandom sequence K, then the weight value $W_{13,2}$ can be obtained by calculate an average of the aggregation of the quantized digital code is multiplied by the pseudorandom sequence K.

Method for determining the weight value $W_{13,2}$ of the sub-capacitor $C_{13,2}$ is as follows: assuming that the input signal is represented by VIN, where VIN=Vip-Vin, and assuming that the digital output of the SAR ADC 400 is represented by DIN, where VIN=DIN+$Q_N$, and $Q_N$ is a quantization error. Because the input signal is added by the dithering signal, that is VIN+($K^*W_{13,2}$), and pseudo random sequence K is "1" or "−1", at this time the digital output of the SAR ADC 400 is represented by Dout, the equation becomes VIN+($K^*W_{13,2}$)=Dout+$Q_N$. Then, the digital output Dout is multiplied by K, and the result is performed by the aggregation and average operation as follows:

$$K \cdot Dout = K \cdot VIN + W_{13,2} - K \cdot Q_N = K \cdot VIN + W_{13,2} - K \cdot Q_N = W_{13,2} + e$$

If the pseudorandom sequence K is long enough, the value "e" will approach zero, and the weight value $W_{13,2}$ can be obtained.

By using the same calculating steps, the weight values of the other sub-capacitors $C_{13,0}, C_{13,1}, \ldots$ of the SAR ADC 400 can be obtained. In the following operations of the SAR ADC 400, the divided sub-capacitors are used as a whole, that is the sub-capacitors $C_{13,0}, C_{13,1}, C_{13,2}, C_{13,3}$ are controlled as a single bit capacitor C13. As for the following switched capacitor control, similar to the conventional SAR ADC, the switched capacitor control is depends on an output of the comparator 430 to achieve the negative feedback convergence. Because a person skilled in this art should understand these operations of the SAR ADC, details about the switched capacitor control of the SAR ADC is omitted here.

In addition, in this embodiment, all the sub-capacitors are calibrated all the time to update their weight values, and the processing circuit 450 generates the digital output by using the updated weight values. In another embodiment of the present invention, the sub-capacitors are calibrated during a period after the SAR ADC 400 starts to work, and the calibration steps can be stopped when the weight values of the sub-capacitors are stabilized. These alternative designs shall fall within the scope of the present invention.

In addition, the digital output Dout generate from the processing circuit 450 can be calculated by the following formula (not a limitation of the present invention):

$$D_{out} = \sum_{i=0}^{i=P-1} W_{P-i-1} \cdot (2b_{i+1} - 1) + b_{P+1} + 2^{N-1} - 1 + Q_N,$$

where bi (from $b_1$ to $b_{P+1}$) is the $i^{th}$ code output by the comparator 430, P is a quantity of the bit capacitors within the first bit capacitor array 410 (in FIG. 4, P=14), and $Q_N$ is quantization error.

Figure 7:
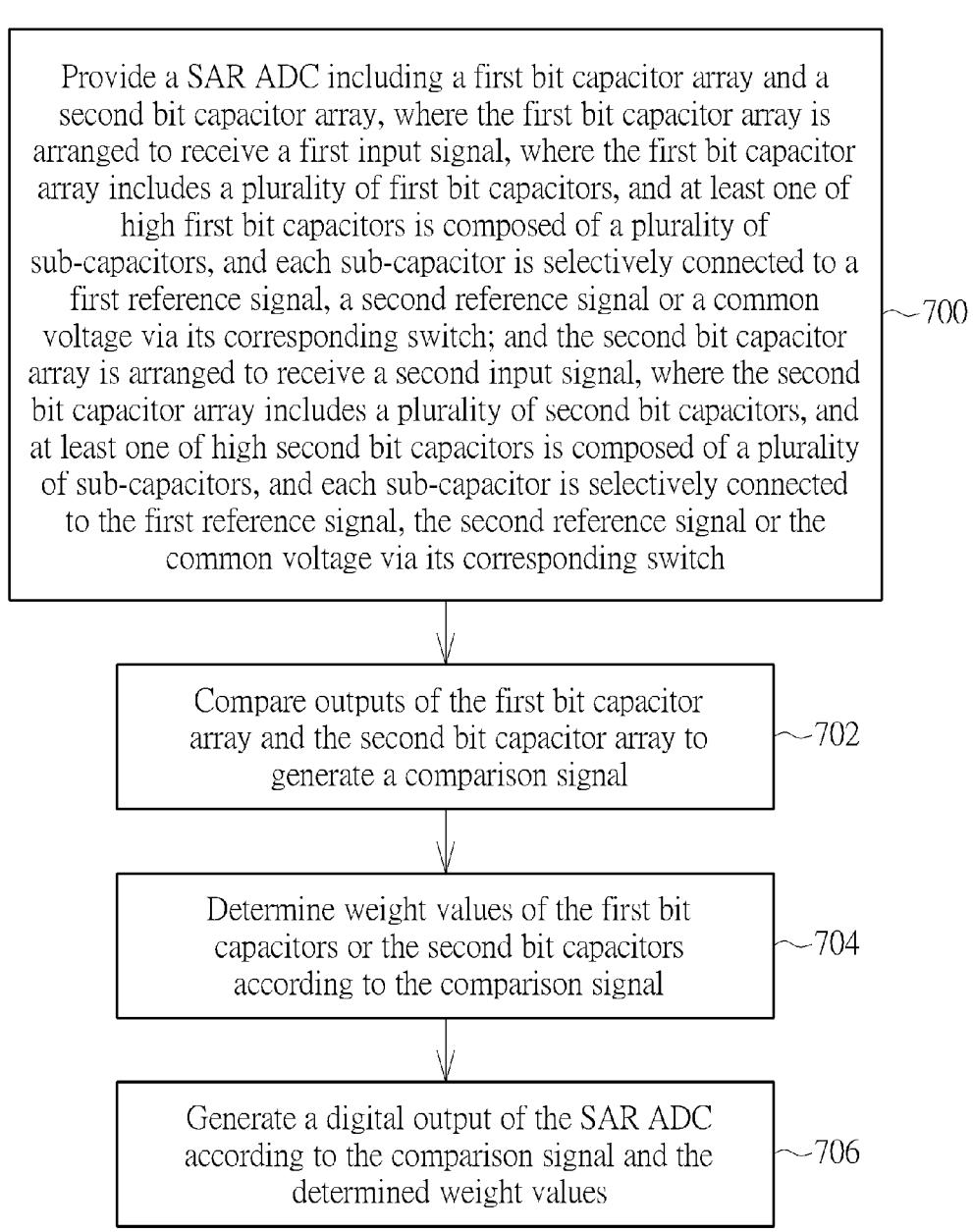
FIG. 7 is a flow chart of a method for controlling a SAR ADC according to one embodiment of the present invention.

Please refer to FIG. 7, which is a flow chart of a method for controlling a SAR ADC according to one embodiment of the present invention. Referring to the above description about FIG. 1 and FIG. 4, the flow shown in FIG. 7 is as follows:

Step 700: Provide a SAR ADC including a first bit capacitor array and a second bit capacitor array, where the first bit capacitor array is arranged to receive a first input signal, where the first bit capacitor array includes a plurality of first bit capacitors, and at least one of high first bit capacitors is composed of a plurality of sub-capacitors, and each sub-capacitor is selectively connected to a first reference signal, a second reference signal or a common voltage via its corresponding switch; and the second bit capacitor array is arranged to receive a second input signal, where the second bit capacitor array includes a plurality of second bit capacitors, and at least one of high second bit capacitors is composed of a plurality of sub-capacitors, and each sub-capacitor is selectively connected to the first reference signal, the second reference signal or the common voltage via its corresponding switch.

Step 702: Compare outputs of the first bit capacitor array and the second bit capacitor array to generate a comparison signal.

Step 704: Determine weight values of the first bit capacitors or the second bit capacitors according to the comparison signal.

Step 706: Generate a digital output of the SAR ADC according to the comparison signal and the determined weight values.

In light of above, the SAR ADC of the present invention has the following advantages: (1) the bit capacitors of the SAR ADC is executed by a complete background calibration, and the working speed of the SAR ADC will not be influenced; (2) the capacitors to be calibrated can continue to join the operations of the SAR ADC, and the main operations of the SAR ADC of the present invention are the same as the conventional art, therefore the design complexity will not increase too much; (3) in the SAR ADC of the present invention, all the bit capacitors whose capacitance is greater than a redundant capacitance are divided into sub-capacitors, and because these sub-capacitors are within a redundant range for a coding of the SAR ADC, it is not needed to limit the swing of the input signal, that is a full swing input signal is allowed, and the dithering signal added to the input signal can be solved by the redundancy; (4) all the sub-capacitors can be sequentially calibrated, therefore, the calibration circuit within the processing circuit can be shared to save the chip area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A successive approximation register analog-to-digital converter (SAR ADC), comprising:
   a first bit capacitor array, for receiving a first input signal, wherein the first bit capacitor array comprises a plurality of first bit capacitors, and at least one of high first bit capacitors is composed of a plurality of sub-capacitors, and each sub-capacitor is selectively connected to a first reference voltage, a second reference voltage or a common voltage via its corresponding switch;
   a second bit capacitor array, for receiving a second input signal, wherein the second bit capacitor array includes a plurality of second bit capacitors, and at least one of high second bit capacitors is composed of a plurality of sub-capacitors, and each sub-capacitor is selectively connected to the first reference voltage, the second reference voltage or the common voltage via its corresponding switch;
   a comparator, coupled to the first bit capacitor array and the second bit capacitor array, for comparing outputs of the first bit capacitor array and the second bit capacitor array to generate a comparison signal; and
   a processing circuit, coupled to the comparator, for controlling capacitor-switching operations of the first bit capacitor array and the second bit capacitor array to generate a digital output of the SAR ADC;
   wherein during a period that the SAR ADC receives the first input signal and the second input signal to generate the digital output, the processing circuit calibrates the sub-capacitors of at least one of the high first bit capacitors of the first bit capacitor array to generate a plurality of weight values of the sub-capacitors, and the processing circuit determines a weight value of the at least one of the high first bit capacitors of the first bit capacitor array according to the weight values of the sub-capacitors; and the processing circuit calibrates the sub-capacitors of at least one of the high second bit capacitors of the second bit capacitor array to generate a plurality of weight values of the sub-capacitors, and the processing circuit determines a weight value of the at least one of the high second bit capacitors of the second bit capacitor array according to the weight values of the sub-capacitors.

2. The SAR ADC of claim 1, wherein capacitances of all the sub-capacitors of the one of the high first bit capacitors of the first bit capacitor array are the same.

3. The SAR ADC of claim 1, wherein the SAR ADC is an N-bit SAR ADC, the first bit capacitors are not binary weighted capacitors; and for each first bit capacitor, its capacitance is not greater than a summation of capacitances of all the lower bit capacitors, and a summation of capacitances of a unit capacitor and all the first bit capacitors is not lower than $2^{(N-1)}$ times a capacitance of a least first bit capacitor.

4. The SAR ADC of claim 3, wherein in the first bit capacitor array, any first bit capacitor whose capacitance is greater than a redundant capacitance is composed of a plurality of sub-capacitors, and a capacitance of each sub-capacitor is less than the redundant capacitance, where the redundant capacitance is a difference between the summation of the capacitances of the unit capacitor and all the first bit capacitors with $2^{(N-1)}$ times the capacitance of the least bit capacitor.

5. The SAR ADC of claim 4, wherein during a period that the SAR ADC receives the first input signal and the second input signal to generate the digital output, the processing circuit calibrates the sub-capacitors of at least one of the high first bit capacitors of the first bit capacitor array to generate a plurality of weight values of the sub-capacitors, and the processing circuit determines a weight value of the at least one of the high first bit capacitors of the first bit capacitor array according to the weight values of the sub-capacitors; and the processing circuit calibrates the sub-capacitors of at least one of the high second bit capacitors of the second bit capacitor array to generate a plurality of weight values of the sub-capacitors, and the processing circuit determines a weight value of the at least one of the high second bit capacitors of the second bit capacitor array according to the weight values of the sub-capacitors.

6. The SAR ADC of claim 1, wherein the SAR ADC allows the first input signal and the second input signal to have full swing.

7. A method for controlling a successive approximation register analog-to-digital converter (SAR ADC), wherein the SAR ADC comprises:
a first bit capacitor array, for receiving a first input signal, wherein the first bit capacitor array comprises a plurality of first bit capacitors, and at least one of high first bit capacitors is composed of a plurality of sub-capacitors, and each sub-capacitor is selectively connected to a first reference voltage, a second reference voltage or a common voltage via its corresponding switch; and
a second bit capacitor array, for receiving a second input signal, wherein the second bit capacitor array includes a plurality of second bit capacitors, and at least one of high second bit capacitors is composed of a plurality of sub-capacitors, and each sub-capacitor is selectively connected to the first reference voltage, the second reference voltage or the common voltage via its corresponding switch; and
the method comprises:
comparing outputs of the first bit capacitor array and the second bit capacitor array to generate a comparison signal;
determining weight values of each first bit capacitors or each second bit capacitors according to the comparison signal;
generating a digital output of the SAR ADC according to the comparison signal and the determined weight values;
during a period that the SAR ADC receives the first input signal and the second input signal to generate the digital output, calibrating the sub-capacitors of at least one of the high first bit capacitors of the first bit capacitor array to generate a plurality of weight values of the sub-capacitors, and determining a weight value of the at least one of the high first bit capacitors of the first bit capacitor array according to the weight values of the sub-capacitors; and
calibrating the sub-capacitors of at least one of the high second bit capacitors of the second bit capacitor array to generate a plurality of weight values of the sub-capacitors, and the determining a weight value of the at least one of the high second bit capacitors of the second bit capacitor array according to the weight values of the sub-capacitors.

8. The method of claim 7, wherein capacitances of all the sub-capacitors of the one of the high first bit capacitors of the first bit capacitor array are the same.

9. The method of claim 7, wherein the SAR ADC is an N-bit SAR ADC, the first bit capacitors are not binary weighted capacitors; and for each first bit capacitor, its capacitance is not greater than a summation of capacitances of all the lower bit capacitors, and a summation of capacitances of a unit capacitor and all the first bit capacitors is not lower than $2^{(N-1)}$ times a capacitance of a least first bit capacitor.

10. The method of claim 9, wherein in the first bit capacitor array, any first bit capacitor whose capacitance is greater than a redundant capacitance is composed of a plurality of sub-capacitors, and a capacitance of each sub-capacitor is less than the redundant capacitance, where the redundant capacitance is a difference between the summation of the capacitances of the unit capacitor and all the first bit capacitors with $2^{(N-1)}$ times the capacitance of the least bit capacitor.

11. The method of claim 7, wherein each of the first input signal and the second input signal is allowed to have full swing.

12. A successive approximation register analog-to-digital converter (SAR ADC), comprising:
a first bit capacitor array, for receiving a first input signal, wherein the first bit capacitor array comprises a plurality of first bit capacitors, and at least one of high first bit capacitors is composed of a plurality of sub-capacitors;
a second bit capacitor array, for receiving a second input signal, wherein the second bit capacitor array includes a plurality of second bit capacitors, and at least one of high second bit capacitors is composed of a plurality of sub-capacitors;
a comparator, coupled to the first bit capacitor array and the second bit capacitor array, for comparing outputs of the first bit capacitor array and the second bit capacitor array to generate a comparison signal; and
a processing circuit, coupled to the comparator, for controlling capacitor-switching operations of the first bit capacitor array and the second bit capacitor array to generate an N-bit digital output of the SAR ADC;
wherein in the first bit capacitor array, any first bit capacitor whose capacitance is greater than a redundant capacitance is composed of a plurality of sub-capacitors, and a capacitance of each sub-capacitor is less than the redundant capacitance, where the redundant capacitance is a difference between a summation of capacitances of a unit capacitor and all the first bit capacitors with $2^{(N-1)}$ times a capacitance of a least bit capacitor.

13. The SAR ADC of claim 12, wherein the first bit capacitors are not binary weighted capacitors; and for each first bit capacitor, its capacitance is not greater than a summation of capacitances of all the lower bit capacitors, and the summation of the capacitances of the unit capacitor and all the first bit capacitors is not lower than $2^{(N-1)}$ times the capacitance of the least first bit capacitor.

* * * * *